United States Patent [19]
O'Brien, Jr.

[11] Patent Number: 6,068,659
[45] Date of Patent: May 30, 2000

[54] METHOD FOR CHARACTERIZING CONGESTION OF OBJECTS IN THREE DIMENSIONS

[75] Inventor: Francis J. O'Brien, Jr., Newport, R.I.

[73] Assignee: The United States of America as represented by the Secretary of the Navy, Washington, D.C.

[21] Appl. No.: 08/986,979
[22] Filed: Dec. 8, 1997
[51] Int. Cl.[7] .................................. G06F 7/60; G06G 7/48
[52] U.S. Cl. ....................................................... 703/2; 703/6
[58] Field of Search .......................... 395/500.23, 500.27; 703/2, 6

[56] References Cited

U.S. PATENT DOCUMENTS 5,402,335  3/1995  O'Brien ................................. 364/401

Primary Examiner—Kevin J. Teska
Assistant Examiner—Hugh Jones
Attorney, Agent, or Firm—Michael J. McGowan; Robert W. Gauthier; Prithvi C. Lall

[57] ABSTRACT

A method is provided for measuring and recording the relative degree of physical density, congestion, or crowding of objects dispersed in a three-dimensional space. A Population Density Index ($PDI_{act}$) is obtained for the actual conditions of the objects within the space as determined from measurements taken of the objects. The $PDI_{act}$ is compared with values of a $PDI_{min}$ and a $PDI_{max}$, considered as minimum and maximum bounds, respectively, for $PDI_{act}$ values. The objects within the space are then repositioned to optimize $PD_{act}$, thus optimizing the layout of objects within the space.

17 Claims, 3 Drawing Sheets 6,068,659

METHOD FOR CHARACTERIZING CONGESTION OF OBJECTS IN THREE DIMENSIONS

STATEMENT OF GOVERNMENT INTEREST

The invention described herein may be manufactured and used by or for the Government of the United States of America for governmental purposes without the payment of any royalties thereon or therefore.

BACKGROUND OF THE INVENTION (1) Field of the Invention

This invention relates to a method for providing layouts of a three dimensional workplace and more particularly to a method for determining the physical density or crowding of a three dimensional workplace so as to optimize the layout of the workspace.

(2) Description of the Prior Art

In the inventor's previous patent entitled "Process Which Aids to the Laying Out of Locations of a Limited Number of 100, Personnel and Equipments in Functional Organization", U.S. Pat. No. 5,235,506, which is incorporated into this disclosure in its entirety by reference, a process is described whereby the relationship among objects in a particular two dimensional work area can be accurately determined to minimize crowding. A crowding index, or Population Density Index (PDI), for the work area, termed $PDI_{act}$, is calculated and compared to theoretical minimum ($PDI_{min}$) and maximum ($PDI_{max}$) values, such that $PDI_{min} < PDI_{act} < PDI_{max}$. The formula for calculating $PDI_{act}$ is as follows:

$$PDI_{act} = \frac{1}{\overline{d}_{act}} \sqrt{\frac{n}{A}} \qquad 1$$

where n=number of objects within the work area;

A =the geometric area of the work area; and $\overline{d}_{act}$=average Euclidean distance among all possible pairs of n objects within the work area.

The values of $PDI_{min}$ and $PDI_{max}$ are given as follows:

$$PDI_{min} = \frac{1}{\overline{\Delta}} \frac{n}{A} \qquad 2$$

and $$PDI_{max} = \frac{1}{c\overline{\Delta}} \sqrt{\frac{n}{A}} \qquad 3$$

where $\overline{\Delta}$=the average Euclidean distance of all possible pairs of points for a unit lattice, i.e., a lattice of n points uniformly distributed in area A; and c=an arbitrary constant which corresponds to the minimum possible spacing between the objects, e.g., personnel standing shoulder to shoulder within a work area would be spaced approximately one foot from head to head, so c would be equal to one foot.

It can be seen that $PDI_{min}$ corresponds to a uniform distribution of n points within the work area, while $PDI_{max}$ corresponds to a uniform distribution of n points within the work area with a minimum distance c between each horizontal and vertical point. With these values determined, $PDI_{act}$ can be optimized to provide the optimum layout for the work area. Two dimensional layouts suffice for a large number of work areas, such as office spaces and typical manufacturing areas. However, for applications where optimum layouts of three dimensional spaces are required, the previous methods are inadequate. Such applications may include space station layouts, robotic manufacturing facilities where robots can operate in any orientation and nano technology structures such as molecular machines. The conventional physical science density measure of the ratio of mass to volume may be used to provide an index of crowding within a three dimensional space. However, this density measure fails to capture the spatial relationship of objects in the space, i.e., moving objects around within the space would not vary the density measure.

SUMMARY OF THE INVENTION

Accordingly, it is a general purpose and object of the present invention to provide a method for optimizing the layout of three dimensional workplaces.

It is a further object of the present invention that the present invention reflect the spatial relationship of objects within a three dimensional shape.

These objects are provided with the present invention by a method for measuring and recording the relative degree of physical density, congestion, or crowding of objects dispersed in a three-dimensional space. A Population Density Index ($PDI_{act}$) is obtained for the actual conditions of the objects within the space as determined from measurements taken of the objects. The $PDI_{act}$ is compared with values of $PD_{min}$ and $PDI_{max}$, considered as minimum and maximum bounds, respectively, for $PDI_{act}$ values. The objects within the space can then be repositioned to optimize $PDI_{act}$ for the three dimensional space and the objects contained within the space, thus optimizing the layout of objects within the space.

BRIEF DESCRIPTION OF THE DRAWINGS

A more complete understanding of the invention and many of the attendant advantages thereto will be readily appreciated as the same becomes better understood by reference to the following detailed description when considered in conjunction with the accompanying drawings wherein corresponding reference characters indicate corresponding parts throughout the several views of the drawings and wherein.

DESCRIPTION OF THE PREFERRED EMBODIMENT

Figure 1A:
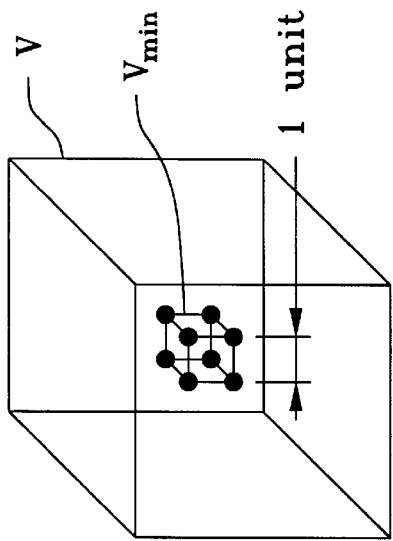
FIG. 1A depicts a volume V of 10×10×10 units with n=8 objects distributed therein.

Referring now to FIG. 1A, there are shown a number "n" of objects "o" dispersed in a three dimensional space, or volume "V". In the schematic representation of FIG. 1A, the objects are represented as solid beads which are locatable within the space by ordinary means of a Cartesian coordinate system with arbitrary origin such that each object has a unique coordinate measurement of location ($x_i$, $y_i$, $z_i$) in the space. It will be appreciated that objects may be mobile within the space. In such instances, the spatial location can be determined by using the desired location of the objects or by locating the objects at a particular point in time. Preferably, V is a parallelepiped, i.e., a solid figure with six faces such that the planes of the faces containing the two opposite sides are parallel. In instances where the objects are not contained within a parallelepiped, such as on open land, sea or air, then a regularly shaped figure is constructed to circumscribe the objects, e.g., the tightest fitting cube or parallelepiped. For purposes of illustration, V is shown in FIG. 1A as a cube having sides equal to 10 units each, i.e., X=10, Y=10 and Z=10.

To characterize the congestion or crowding of the objects within the space, the system and method of the present invention utilizes the fundamental characterization measure of congestion called the Population Density Index (PDI). Extending the two dimensional $PDI_{act}$ of equation 1 to three dimensions, we substitute the volume of the space V for the area A of the two dimensional space and use a cube root to obtain:

$$PDI_{act} = \frac{1}{\bar{d}_{act}} \sqrt[3]{\frac{n}{V}}. \qquad 4$$

Figure 1B:
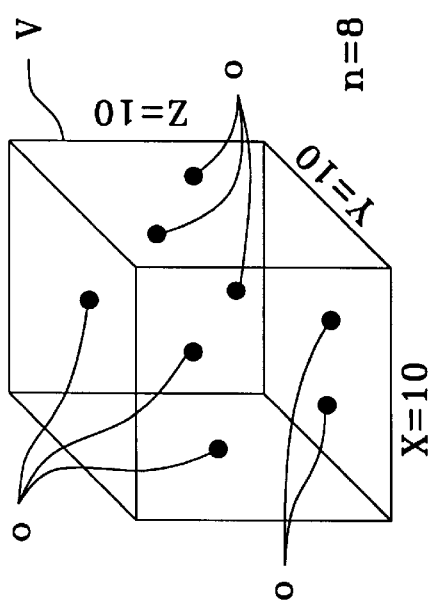
FIG. 1B depicts the volume V with a hypothetical maximum congestion of the objects.
Figure 1C:
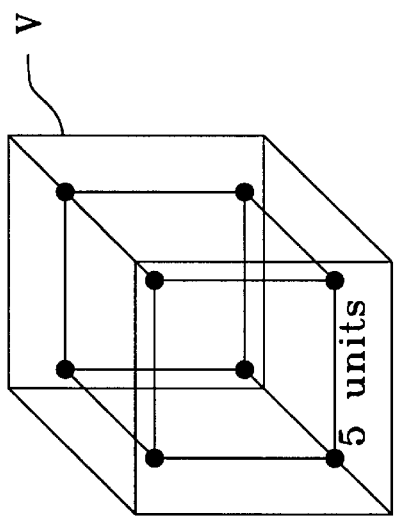
FIG. 1C depicts the volume V with a hypothetical minimum congestion of the objects.

To gauge the relative degree of congestion for a given dispersion of objects provided by the formula $PDI_{act}$, or similar dispersions of the same number of objects dispersed in the same space, lower and upper limits of the bounds of possible congestability, $PDI_{min}$ and $PDI_{max}$, respectively, need to be determined. Referring now additionally to FIG. 1B, to model the upper limit of $PDI_{act}$, we inscribe a smaller volume, $V_{min}$, inside the original volume V. The smaller volume has the same relative dimensions and orientation as the original volume. $V_{min}$ is obtained by assuming that the objects are uniformly pushed together so that each consecutive pair of objects (parallel to the axes of the parallelepiped circumscribing the objects) has the minimum distance between the objects. In the illustration of FIG. 1B, the distance is taken as 1 unit. The minimum distance, however, is a function of the physical size of the objects being arranged within the volume. For example, when arranging workers within a three dimensional work volume, the minimum distance could be taken as the center to center distance of workers standing shoulder to shoulder. The minimum distance illustrated in FIG. 1B corresponds to a minimum for the average distance between objects, i.e., to the minimum value for the $\bar{d}$ term of equation 4. Referring now additionally to FIG. 1C, the lower limit of congestability is obtained by uniformly distributing the objects within the volume, V, such that each consecutive pair of objects (again parallel to the axes of the parallelepiped circumscribing the objects) has the maximum distance between each object. It is to be noted that the arrangement of objects in FIG. 1C also maintains the relative dimensions and orientation of the original volume V. Essentially, FIG. 1C is an expanded version of FIG. 1B, i.e., the spatial arrangement of the objects is the same, but the distances between the objects have increased. In the illustration of FIG. 1C, each object occupies a cube 5 units per side, thus the maximum distance is seen to be 5 units. $PDI_{max}$ and $PDI_{min}$ are then obtained based on the arrangements of objects in FIG. 1B and in FIG. 1C, respectively.

Figure 2:
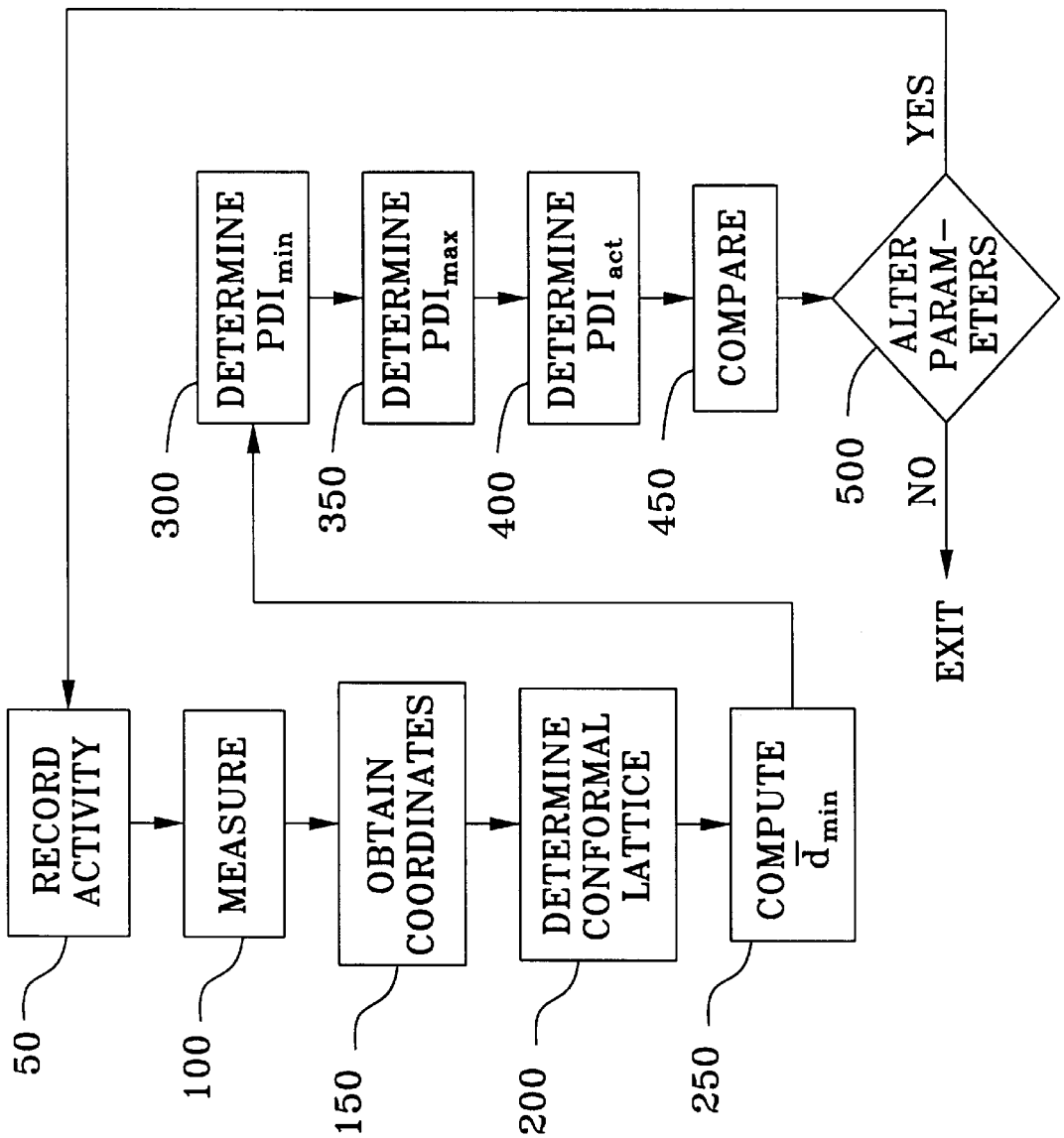
FIG. 2 is a flow chart of the method of the present invention.

For the cubic volume and objects illustrated in FIGS. 1A through 1C, the determination of $V_{min}$ and the maximum distance between objects is essentially intuitive. However, to accommodate real world volumes and arrangements of objects the determination of $PDI_{min}$ and $PDI_{max}$ must be generalized. Referring now to FIG. 2, there is shown a flow diagram of the steps used to obtain the congestability measures, $PDI_{min}$, $PDI_{max}$ and $PDI_{act}$, for an arrangement of objects in a volume. In step 50, one records the activities of the objects and determines at which point in time the congestability measures will be determined. For static objects, the timing will not influence the results. However, in a dynamic situation, the timing should be chosen to obtain the most representative arrangements of objects. In step 100, the parameters n and V are measured, where n is the number of objects. In order to use the method of the present invention, n must be a nonprime number. Where n is a prime number, such as 17, 19, etc., then n is taken as the next higher nonprime number; e.g., n=18 would be used in place of n=17. V is the size of the volume containing the n objects. Typically, the volume will be a rectangularly shaped figure such as a room, cage, etc. with measurable sides called X (horizontal length), Y (vertical width) and Z (height), as illustrated by FIG. 1A. In applications of the method in which the n points are not circumscribed by a rectangularly shaped figure, then a rectangularly shaped figure which encloses the objects is constructed in any convenient manner and this construct is used in determining the congestability measures. The measurements can be taken in any convenient units, provided that consistent units are used throughout.

Figure 3:
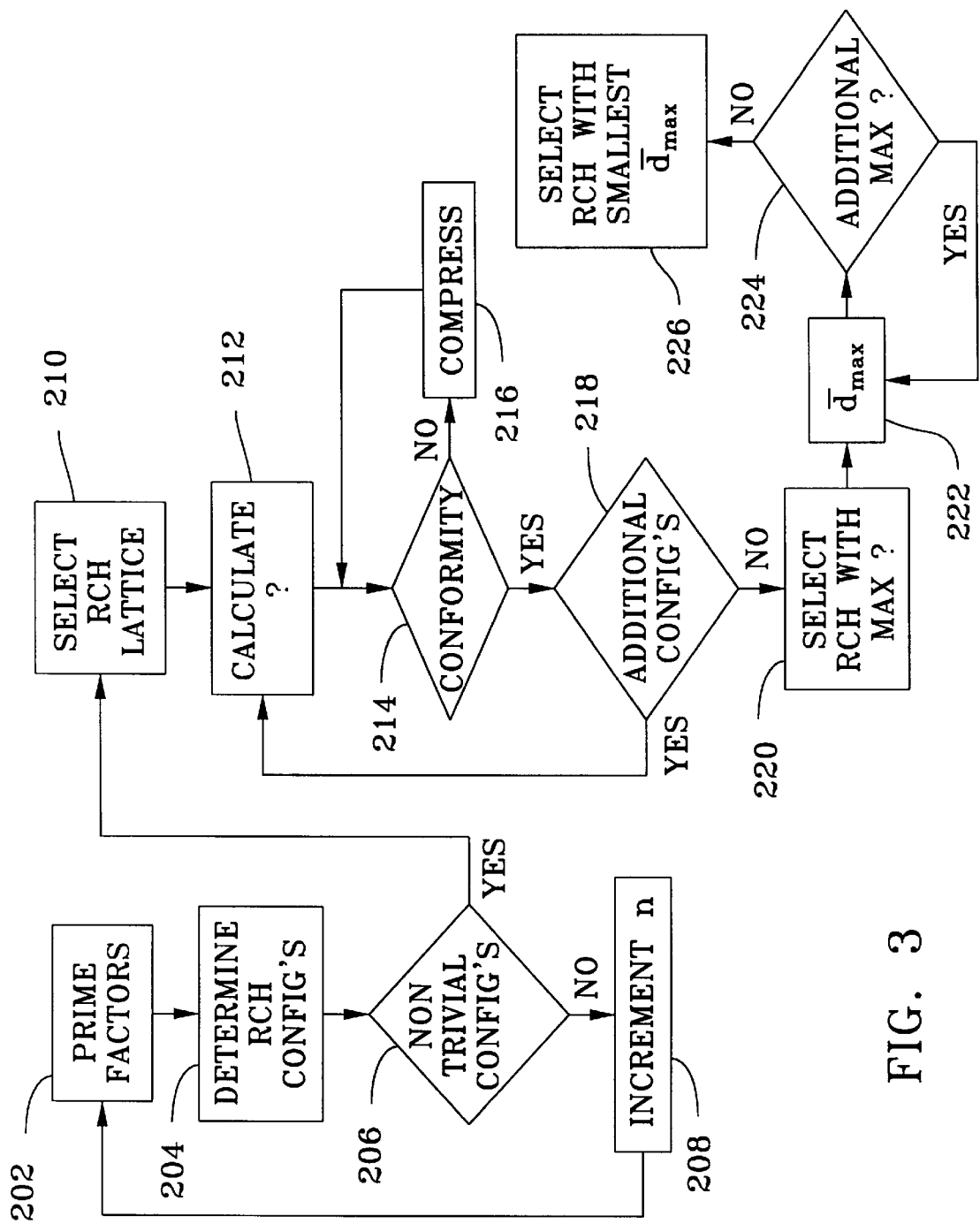
FIG. 3 is a detailed flow chart for selecting a conformal lattice.

In step 150, the Cartesian coordinates of each of the objects is obtained. To obtain a unique set of coordinates for each object, the coordinates of a representative point for each object are used. For example, the coordinates of an object such as a worker may be taken at a point coincident with the middle of the worker's torso. Step 200 determines the arrangement of objects corresponding to the minimum and maximum spacing of the objects as illustrated in FIGS. 1B and 1C, respectively. The arrangement can be seen to be in the shape of a conformal lattice of R rows, C columns and H in height. The objective of step 200 is to determine a unique, finite, discrete, conformal RCH lattice of points for determining the hypothetical lower and upper bounds of the congestion metrics, $PDI_{min}$ and $PDI_{max}$. Referring now to FIG. 3, there is shown a flow chart of the detailed steps required to determine a conformal RCH lattice.

The selection of an RCH lattice is based on number theory concepts. In particular, we are interested in sets and subsets of composite numbers that can be expressed as three-integer products. The value of n is first expressed, at step 202, in terms of the prime factors of the whole number:

$$n = \prod_{j=1}^{r} P_j^{\alpha_j}, \qquad 5$$

where $P_j$ represents the jth prime number and $\alpha_j$ is the number of occurrences of the jth prime number of n. For example, composite 30 can be decomposed into $P_1^{\alpha_1} P_2^{\alpha_2} P_3^{\alpha_3} 2 \times 3 \times 5$. Next, step 204 derives the total number of possible RCH product configurations of n (n=R×C×H) in order to create the set of RCH configurations. This can be derived by letting $\tau(n)$ represent the total number of all possible three-way configurations of a composite integer n. Then it can be shown that the number of all possible three-way configurations of a composite integer n is obtained from equation 5 by the relation:

$$\tau(n) = \frac{1}{2r} \prod_{j=1}^{r} (\alpha_j + 1)(\alpha_j + 2). \qquad 6$$

For example, n=30=2×3×5 can be partitioned into $\tau(30)=1/2^3(2)(3)(2)(3)(2)(3)=27$ three-integer products, listed as follows:

| | | | | | | | |
|---|---|---|---|---|---|---|---|
| 1x 1x 30 | 2x 1x 15 | 3x 1x 10 | 5x 1x 6 | 6x 1x 5 | 10x 1x 3 | 15x 1x 2 | 30x 1x 1 |
| 1x 2x 15 | 2x 3x 5 | 3x 2x 5 | 5x 2x 3 | 6x 5x 1 | 10x 3x 1 | 15x 2x 1 | |
| 1x 3x 10 | 2x 5x 3 | 3x 5x 2 | 5x 3x 2 | | | | |
| 1x 5x 6 | 2x 15x 1 | 3x 10x 1 | 5x 6x 1 | | | | |
| 1x 6x 5 | | | | | | | |
| 1x 10x 3 | | | | | | | |
| 1x 15x 2 | | | | | | | |
| 1x 30x 1 | | | | | | | |

Next, at step 206, the set of the $\tau(n)$ configurations is examined to determine if there are nontrivial configurations, i.e., those configurations not having a factor of 1. It can be seen that there are six nontrivial configurations for the above listing: 2×3×5; 3×2×5; 5×2×3; 2×5×3; 3×5×2; and 5×3×2. It will be appreciated that for some numbers (e.g., n=10), no nontrivial configurations are possible. In such cases, step 206 branches to step 208 to increment n to the next higher nonprime number and return to step 202. Once n yields nontrivial configurations, step 210 selects the RCH lattice configuration with dimensions most commensurate with the exterior dimensions of volume V, i.e., the relative order of the magnitude of the R, C and H values for the lattice must match the relative order of the magnitude of the X, Y and Z dimensions of volume V. For example, if V=8×6×10 (Z≧X≧Y), then for a given n, the selected RCH lattice is of order H≧R≧C.

In step 212, the initial uniform interpoint spacing parameter δ, is determined. δ represents the relationship between volume V and lattice RCH, such that:

$$\delta = \sqrt[3]{\frac{V}{n}} = \sqrt[3]{\frac{XYZ}{RCH}}. \qquad 7$$

Next, at step 214, test for conformity of the dimensions of the selected lattice to volume V dimensions. If any of the R, C, H dimensions is nonconformal, i.e., if (R−1)δ>X, or (C−1)δ>Y, or (H−1)δ>Z, then the lattice dimensions are compressed at step 216 by adjusting δ using the relation:

$$\delta = \min[X/(R-1), Y/(C-1), Z/(H-1)] - \epsilon, \qquad 8$$

where min indicates taking the minimum of the quantities within the brackets and $\epsilon$ is a small number, such that $\epsilon^3 \cong 0$. Steps 214 and 216 are repeated until the lattice is conformal. When commensurability is achieved simultaneously by more than one lattice configuration, step 218 repeats steps 212 through 216 for each such configuration. Step 220 compares the value δ for each configuration and selects the RCH configuration with the maximum value of δ. Step 222 calculates the average distance of maximum congestion, $\bar{d}_{max}$ based on the relationship:

$$\bar{d}_{max} = \bar{\Delta}(RCH) = \frac{\sum_{k=1}^{7} T_k}{n(n-1)/2}, \qquad 9$$

where $$T_1 = CH \sum_{i=1}^{R-1} (R-i)i; \qquad 10a$$

$$T_2 = RH \sum_{j=1}^{C-1} (C-j)j; \qquad b$$

$$T_3 = RC \sum_{k=1}^{H-1} (H-k)k; \qquad c$$

$$T_4 = 2H \sum_{i=1}^{R-1} \sum_{j=1}^{C-1} (R-i)(C-j)\sqrt{i^2 + j^2}; \qquad d$$

$$T_5 = 2C \sum_{i=1}^{R-1} \sum_{k=1}^{H-1} (R-i)(H-k)\sqrt{i^2 + k^2}; \qquad e$$

$$T_6 = 2R \sum_{j=1}^{C-1} \sum_{k=1}^{H-1} (C-j)(H-k)\sqrt{j^2 + k^2}; \text{ and} \qquad f$$

$$T_7 = 4 \sum_{i=1}^{R-1} \sum_{j=1}^{C-1} \sum_{k=1}^{H-1} (R-i)(C-j)(H-k)\sqrt{i^2 + j^2 + k^2}. \qquad g$$

The equations 10a–g are derived from the geometry of a lattice of maximum congestion, i.e., a lattice with an interpoint distance of one unit. Equations 10a–c provide the sum of distances between objects for objects lying along a line parallel to an axis. For example, equation 10a gives the sum of all the distances between objects for objects lying along a line parallel to the X axis with the sum multiplied by the total number of such strings, CH. Similarly, each of the equations 10d–f provides the sum of distances between objects within the same plane. Equation log provides the sum of distances between objects in separate planes.

Step 224 checks if plural maxima δ occur, and returns to step 222 to calculate $\bar{d}_{max}$ for each such δ, with step 226 selecting the RCH configuration associated with the smallest value of $\bar{d}_{max}$.

Referring back to FIG. 2, step 250 computes the average distance of minimum congestion based on the relationship:

$$\bar{d}_{min} = \delta \bar{\Delta}(RCH), \qquad 11$$

i.e., the average distance of maximum congestion as determined at step 222 is multiplied by the scaling parameter δ obtained from step 212 or step 216. The $PDI_{min}$ and $PDI_{max}$ are then determined from the relationships $$PDI_{min} = \frac{1}{\bar{d}_{min}} \sqrt[3]{\frac{n}{V}}, \text{ and} \qquad 12$$

$$PDI_{max} = \frac{1}{\bar{d}_{max}} \sqrt[3]{\frac{n}{V}} \qquad 13$$

at steps 300 and 350, respectively.

At step 400, the actual Population Density Index, $PDI_{act}$, is determined using equation 4, with $\bar{d}_{act}$ being the average Euclidean distance between pairs of objects as previously defined, but adapted to a three dimensional volume using the relation:

$$\overline{d}_{act} = \frac{\sum_{i,j}^{n} \sqrt{(x_i - x_j)^2 + (y_i - y_j)^2 + (z_i - z_j)^2}}{(n)(n-1)/2}. \quad 14$$

One can then compare the $PDI_{act}$ for a layout of objects within a volume to theoretical maximum and minimum crowding measures, $PDI_{max}$ and $PDI_{min}$ at step 450. A decision as to whether to alter the parameters of the layout or volume is then made at step 500. Depending on the crowding measures determined by the method, the layout can be altered for the same number of objects within the same volume to either increase or decrease crowding. Alternatively, the number of objects, or the size of the volume, or any combination of the layout, number of objects or size of the volume can be altered and new crowding measures determined. The steps are repeated until an optimum layout is determined, i.e., the crowding measures fall within an arbitrary optimum range of values.

What has thus been described is a method which can be used to optimize the layout of objects in a three dimensional space. The method measures the locations of the objects and the dimensions of a parallelepiped volume containing the objects. Based on the number of objects and the dimensions of the volume, a theoretical minimum crowding measure, $PDI_{min}$, and a theoretical maximum crowding measure, $PDI_{max}$, are determined. An actual crowding measure, $PDI_{act}$, is determined using the average Euclidean distance between pairs of objects in the space and is compared to $PDI_{min}$ and $PDI_{max}$. The layout, volume or number of objects can then be varied and the method repeated until an optimum layout is determined. The method provides an improved density better measure over the standard ratio of mass to volume by using the average Euclidean distance between objects in determining $PDI_{act}$, thus accounting for the spatial relationship among the objects within the volume.

The method can also provide an alternative measure of congestion when exact coordinate measures and thus average distance between objects cannot be obtained or are too burdensome to determine. Once a value for $\delta$ has been determined from either step 212 or step 216, the volume is divided into smaller volumes of size $\delta^3$. This can be accomplished by stringing dividing lines between opposite faces of the parallelepiped. The number m' of smaller volumes containing one or more objects is then counted. The alternative measure of congestion, termed $V_o$, is then taken as the ratio of m' over the number of objects n:

$$V_o = m'/n. \quad 15$$

While this measure $V_o$ omits interobject distance information, it does provide meaningful information on object congestion in three-dimensions by taking into account relative location, whereas the conventional measure of density ignores such information altogether.

Thus, it will be understood that additional changes in the details and arrangement of steps, which have been herein described and illustrated in order to explain the nature of the invention, may be made by those skilled in the art within the principle and scope of the invention as expressed in the appended claims.

What is claimed is:

1. A method for optimizing a layout of objects in a three dimensional space comprising the steps of:

counting the objects, the number of objects being denoted as n;

measuring the dimensions of a volume, V, encompassing the objects, the dimensions being denoted as X, Y and Z;

determining a conformal lattice of points having lattice dimensions, denoted as R, C and H, proportionate to the volume dimensions, X, Y and Z, respectively, the lattice sized such that the objects can be arranged to have one of the objects occupy each lattice point with minimum spacing between pairs of objects;

determining a scaling parameter, $\delta$, using the relationship $$\delta = \sqrt[3]{\frac{XYZ}{RCH}};$$

determining a maximum measure of congestion, $PDI_{max}$, using the relationship $$PDI_{max} = \frac{1}{\overline{d}_{max}} \sqrt[3]{\frac{n}{V}},$$

where $\overline{d}_{max}$ is an average distance between pairs of objects when arranged to have one of the objects occupy each lattice point;

determining a minimum measure of congestion, $PDI_{min}$, using the relationship $PDI_{min} = PDI_{max}/\delta$;

determining a measure of congestion for the layout, $PDI_{act}$, using the relationship $$PDI_{act} = \frac{1}{\overline{d}_{act}} \sqrt[3]{\frac{n}{V}},$$

where $\overline{d}_{act}$ is an average distance between pairs of objects in the layout; and iteratively adjusting the layout of objects and determining $PDI_{act}$, $PDI_{min}$ and $PDI_{max}$ such that $PDI_{act}$ is within the bounds $PDI_{min} < PDI_{act} < PDI_{max}$.

2. The method of claim 1 further comprising the step of observing the objects to determine a time at which to begin the step of counting the objects, the time corresponding to a representative arrangement of the objects.

3. The method of claim 1 wherein the $PDI_{act}$ determining step further comprises the steps of:

obtaining a set of coordinates, $x_i$, $y_i$ and $z_i$, for each object; and obtaining $\overline{d}_{act}$ from the relationship $$\overline{d}_{act} = \frac{\sum_{i,j}^{n} \sqrt{(x_i - x_j)^2 + (y_i - y_j)^2 + (z_i - z_j)^2}}{(n)(n-1)/2}.$$

4. The method of claim 1 wherein the conformal lattice step further comprises the steps of:

incrementing n when n is a prime number;

determining a set of all possible configurations of the lattice such that $n = R \times C \times H$;

determining a subset of configurations with $R \neq 1$, $C \neq 1$ and $H = 1$;

returning to the step of incrementing n when the subset is not populated; and selecting a member of the subset when the subset is populated.

5. The method of claim 4 wherein the member selecting step further comprises the steps of:

determining the scaling parameter for each member of the subset; and selecting at least one member of the subset having a maximum scaling parameter.

6. The method of claim 5 wherein the step of determining the scaling parameter of each member of the subset further comprises the steps of:

testing for conformity of the lattice dimensions and the volume dimensions, the dimensions conforming when $(R-1) \geq X$ and $(C-1) \geq Y$ and $(H-1) \geq Z$; and returning to the testing step with $\delta$ adjusted by the relation $\delta = \min[X/(R-1), Y/(C-1), Z/(H-1)] - \epsilon$ when the dimensions are not conforming, where $\min[\ldots]$ denotes taking the minimum of the quantities within the brackets and $C$ is a small number such that $\epsilon^3 \cong 0$.

7. The method of claim 5 wherein the step of selecting at least one member of the subset further comprises the steps of:

determining $\bar{d}_{max}$ for each member of the subset having the maximum scaling parameter; and selecting as the at least one member, the member of the subset having the maximum scaling parameter and the minimum $\bar{d}_{max}$.

8. A method for optimizing a layout of objects in a three dimensional space comprising the steps of:

counting the objects, the number of objects being denoted as n;

measuring the dimensions of a volume, V, encompassing the objects, the dimensions being denoted as X, Y and Z;

determining a conformal lattice of points having lattice dimensions, denoted as R, C and H, proportionate to the volume dimensions, X, Y and Z, respectively, the lattice sized such that the objects can be arranged to have one of the objects occupy each lattice point with minimum spacing between pairs of objects;

determining a scaling parameter, $\delta$, using the relationship $$\delta = \sqrt[3]{\frac{XYZ}{RCH}};$$

dividing volume V into smaller volumes of size $\delta^3$;

counting the number, m', of smaller volumes containing one or more objects;

determining a measure of congestion, $V_o$, using the relationship $V_o = m'/n$; and iteratively adjusting the layout of objects and determining $V_o$ such that $V_o$ is within the bounds $1/n < V_o < 1$.

9. The method of claim 8 wherein the conformal lattice determining step further comprises the steps of:

incrementing n when n is a prime number;

determining a set of all possible configurations of the lattice such that $n = R \times C \times H$;

determining a subset of configurations with $R \neq 1$, $C \neq 1$ and $H \neq 1$;

returning to the step of incrementing n when the subset is not populated; and selecting a member of the subset when the subset is populated.

10. The method of claim 9 wherein the member selecting step further comprises the steps of:

determining the scaling parameter for each member of the subset; and selecting at least one member of the subset having a maximum scaling parameter.

11. The method of claim 10 wherein the step of determining the scaling parameter of each member of the subset further comprises the steps of:

testing for conformity of the lattice dimensions and the volume dimensions, the dimensions conforming when $(R-1) \geq X$ and $(C-1) \geq Y$ and $(H-1) \geq Z$; and returning to the testing step with 6 adjusted by the relation $\delta = \min[X/(R-1), Y/(C-1), Z/(H-1)] - \epsilon$ when the dimensions are not conforming, where $\min[\ldots]$ denotes taking the minimum of the quantities within the brackets and $\epsilon$ is a small number such that $\epsilon^3 \cong 0$.

12. The method of claim 1 wherein the layout adjusting further comprises adjusting a location of at least one of the objects within the space.

13. The method of claim 1 wherein the layout adjusting further comprises adjusting boundaries of the space.

14. The method of claim 4 wherein determining a set further comprises obtaining all possible configurations of the lattice from the relationship $$\tau(n) = \frac{1}{2^r} \prod_{j=1}^{r} (\alpha_j + 1)(\alpha_j + 2)$$

where:

r is a count of prime number factors of n; and $\alpha_j$ is a count of occurrences of the jth prime number of n.

15. The method of claim 9 wherein determining a set further comprises obtaining all possible configurations of the lattice from the relationship $$\tau(n) = \frac{1}{2^r} \prod_{j=1}^{r} (\alpha_j + 1)(\alpha_j + 2),$$

where:

r is a count of prime number factors of n; and $\alpha_j$ is a count of occurrences of the jth prime number of n.

16. The method of claim 1 wherein $\bar{d}_{max}$ is determined from the relationship $$\bar{d}_{max} = \bar{\Delta}(RCH) = \frac{\sum_{k=1}^{7} T_k}{n(n-1)/2},$$

where:

$$T_1 = CH \sum_{i=1}^{R-1} (R-i)i;$$

$$T_2 = RH \sum_{j=1}^{C-1} (C-j)j;$$

-continued $$T_3 = RC\sum_{k=1}^{H-1}(H-k)k;$$

$$T_4 = 2H\sum_{i=1}^{R-1}\sum_{j=1}^{C-1}(R-i)(C-j)\sqrt{i^2+j^2}\ ;$$

$$T_5 = 2C\sum_{i=1}^{R-1}\sum_{k=1}^{H-1}(R-i)(H-k)\sqrt{i^2+k^2}\ ;$$

$$T_6 = 2R\sum_{j=1}^{C-1}\sum_{k=1}^{H-1}(C-j)(H-k)\sqrt{j^2+k^2}\ ;\text{ and}$$

$$T_7 = 4\sum_{i=1}^{R-1}\sum_{j=1}^{C-1}\sum_{k=1}^{H-1}(R-i)(C-j)(H-k)\sqrt{i^2+j^2+k^2}\ .$$

17. The method of claim 8 wherein $\bar{d}_{max}$ is determined from the relationship $$\bar{d}_{max} = \bar{\Delta}(RCH) = \frac{\sum_{k=1}^{7}T_k}{n(n-1)/2},$$

where:

$$T_1 = CH\sum_{i=1}^{R-1}(R-i)i;$$

$$T_2 = RH\sum_{j=1}^{C-1}(C-j)j;$$

$$T_3 = RC\sum_{k=1}^{H-1}(H-k)k;$$

$$T_4 = 2H\sum_{i=1}^{R-1}\sum_{j=1}^{C-1}(R-i)(C-j)\sqrt{i^2+j^2}\ ;$$

$$T_5 = 2C\sum_{i=1}^{R-1}\sum_{k=1}^{H-1}(R-i)(H-k)\sqrt{i^2+k^2}\ ;$$

$$T_6 = 2R\sum_{j=1}^{C-1}\sum_{k=1}^{H-1}(C-j)(H-k)\sqrt{j^2+k^2}\ ;\text{ and}$$

$$T_7 = 4\sum_{i=1}^{R-1}\sum_{j=1}^{C-1}\sum_{k=1}^{H-1}(R-i)(C-j)(H-k)\sqrt{i^2+j^2+k^2}\ .$$

* * * * *